US009648770B1

(12) United States Patent
MacKillop

(10) Patent No.: US 9,648,770 B1
(45) Date of Patent: May 9, 2017

(54) HIGH-VOLTAGE, ALTERNATING CURRENT POWER SUPPLY

(71) Applicant: Kenneth Martin MacKillop, Lowell, MA (US)

(72) Inventor: Kenneth Martin MacKillop, Lowell, MA (US)

(73) Assignee: STATIC CLEAN INTERNATIONAL, INC., North Billerica, MA (US)

( * ) Notice: Subject to any disclaimer, the term of this patent is extended or adjusted under 35 U.S.C. 154(b) by 220 days.

(21) Appl. No.: 14/496,657

(22) Filed: Sep. 25, 2014

Related U.S. Application Data

(60) Provisional application No. 61/882,362, filed on Sep. 25, 2013.

(51) Int. Cl.
| | | |
|---|---|---|
| *H05K 7/00* | (2006.01) | |
| *H05K 7/10* | (2006.01) | |
| *H05K 1/18* | (2006.01) | |
| *H02M 5/10* | (2006.01) | |

(52) U.S. Cl.
CPC ............... *H05K 7/10* (2013.01); *H02M 5/10* (2013.01); *H05K 1/181* (2013.01)

(58) Field of Classification Search
CPC .. H01F 27/022; H01F 27/266; H01F 27/2828; H01F 27/2866; H01F 27/326; H01F 38/10; H01F 41/005; H05B 41/2881; H05K 7/10
See application file for complete search history.

(56) References Cited

U.S. PATENT DOCUMENTS

| | | | | | |
|---|---|---|---|---|---|
| 2,117,138 | A | * | 5/1938 | Bock .......................... | G05F 1/34 307/151 |
| 3,294,947 | A | * | 12/1966 | Whitmore ............ | G03D 13/002 219/469 |
| 5,930,105 | A | * | 7/1999 | Pitel ........................ | H01T 23/00 361/212 |
| 2001/0030541 | A1 | * | 10/2001 | Fujita ...................... | H01T 19/00 324/455 |
| 2008/0284340 | A1 | * | 11/2008 | Varga .................. | H01F 27/2828 315/82 |
| 2009/0096562 | A1 | * | 4/2009 | Nakadai .................. | H01F 38/42 336/67 |

* cited by examiner

*Primary Examiner* — Yuriy Semenenko
(74) *Attorney, Agent, or Firm* — Kriegsman & Kriegsman

(57) ABSTRACT

A high-voltage, AC power supply for an electrostatic discharge system comprises a chassis shaped to define an interior cavity, a high-voltage transformer for increasing the voltage received from an external power source, and an output connector module in electrical connection with the transformer for delivering the increased voltage to a high-voltage load, such as one or more anti-static bars. The transformer and the output connector are independently mounted onto the chassis within the interior cavity in a spaced apart relationship and are electrically coupled through one or more flying lead connectors in order to facilitate assembly. During operation, a resistive damping component in the output connector module regulates the output voltage and secondary current delivered to the load in order to render the power supply less susceptible to dielectric breakdown from partial discharge.

16 Claims, 6 Drawing Sheets

HIGH-VOLTAGE, ALTERNATING CURRENT POWER SUPPLY

FIELD OF THE INVENTION

The present invention relates generally to power supplies and, more particularly, to high-voltage, alternating current (AC) power supplies that are commonly utilized in static neutralization systems.

BACKGROUND OF THE INVENTION

Static neutralization systems are well known in the art and are commonly utilized at various stages of product fabrication and packaging to remove potentially interfering, electrostatic charges from materials that readily develop static electricity, such as paper and plastic. Conventionally, static neutralization systems operate by emitting a field of positive and negative ions that neutralize any electrostatic charge present on the treated material.

Static neutralization systems typically comprise one or more high-voltage, air-ionizing, anti-static electrodes, or bars, which are electrically coupled to a common, alternating current (AC) power supply capable of producing relatively high voltages (e.g., in the order of 7.5 kV). Once electrically coupled to the power supply, each elongated, linear, anti-static bar is manually manipulated or fixedly mounted to best serve the intended static removal application. An example of an anti-static bar, or static eliminator, is disclosed in U.S. Pat. No. 3,120,626 to H. Schweriner, the disclosure of which is incorporated herein by reference.

Referring now to FIG. 1, there is shown a simplified schematic representation of a conventional, high-voltage, AC power supply 11 for use in static neutralization systems. As can be seen, power supply 11 includes a generally enclosed, box-shaped, outer housing, or chassis, 13 into which is disposed a supply circuit 15. Supply circuit 15 typically comprises a high-voltage transformer 17 for stepping up, or increasing, the voltage produced from an external AC power source 19 (e.g., AC mains electricity). Transformer 17 generally includes a laminated core 21 that is connected to external AC power source 19 by a primary winding 23. A pair of high-voltage, output connectors 25-1 and 25-2, each of which terminates into an externally accessible, output port 27 (e.g., an electrical socket with spring coupling means for quick connection/disconnection), is connected to a secondary winding 29 for transformer 17 via a common contact 31, such as a screw contact. Additionally, transformer 17 commonly includes a magnetic shunt 33 between primary winding 23 and secondary winding 29 in order to limit the output current and to control imbalances in flux between windings 23 and 29.

During the assembly process, at least a portion of core 21, output connectors 25, secondary winding 29 and contact 31 are encapsulated within a generally cup-shaped, dielectric block 35, as shown in simplified form in FIG. 1. Dielectric block 35 serves, inter alia, to limit the effects of any partial discharge of electricity along the voltage supply path. Furthermore, a dielectric potting compound, such as asphalt, is often deposited into certain voids within chassis 13 to suppress any noise and/or minimize the risk of a shunt condition in response to an electrical discharge along the voltage supply path.

Although well known in the art and widely used in commerce, conventional high-voltage, AC power supplies of the type described in detail above have been found to suffer from a few notable shortcomings.

As a first shortcoming, conventional high-voltage, AC power supplies of the type described in detail above have been found to be unreliable and prone to early operational failure. In particular, conventional high-voltage, AC power supplies have been found to exhibit partial discharge (i.e., a discharge of electricity that results in a breakdown of dielectric material within a region of contact between conducting elements) below operating voltage. If any dielectric material either (i) inadequately encapsulates electrical components along the supply path (e.g., due to imperfections in the block that create small air cavities) or (ii) breaks down, or becomes otherwise damaged, a discharge of electricity can result in a shunt condition, which may render the power supply inoperable or otherwise damaged.

Traditional high-voltage, AC power supplies often utilize a variety of different techniques to remedy the effects of partial discharge. One technique for minimizing the effects of partial discharge involves utilizing a dielectric material that is less susceptible to breakdown, such as an oil-based or gas-based dielectric. Another technique for minimizing the effects of partial discharge involves vacuum encapsulating regions prone to discharge (e.g., at the point of connection to the secondary winding where the electric field and flux density are highest). However, it has been found that both of the aforementioned techniques are rather cost-prohibitive to implement in static neutralization applications.

As a second shortcoming, conventional high-voltage, AC power supplies of the type described in detail above have been found to be limited in performance. In particular, the use of a transformer with a laminated core often results in oversaturation, which in turn limits the rise and minimizes the peak elevation of the output voltage under load.

As a third shortcoming, conventional high-voltage, AC power supplies of the type as described in detail above have been found to be rather rigid in design and difficult to assemble. Most notably, the inclusion of the relatively large, encapsulating, dielectric block renders the assembly process rather costly (due to the customized geometry of each block), time-consuming (to accommodate for the lengthy curing period of the encapsulating material) and structurally inflexible in nature. For instance, the output connectors are indirectly affixed the chassis through the fixedly mounted transformer core, since all components are encapsulated within a common dielectric block. To accommodate for the lack of flexibility in positioning the output connectors, the openings provided in the chassis to receive the output connectors are often slightly enlarged. This enlargement, or clearance, of each opening in the chassis results in small air gaps between the output port, or socket, for each output connector and the wall of the housing in which it is located. As referenced above, the presence of air gaps along the voltage supply path can result in partial electrical discharge, which in turn can degrade selected electrical components and/or dielectric materials (e.g., the encapsulating block or potting compound).

SUMMARY OF THE INVENTION

It is an object of the present invention to provide a new and improved high-voltage, alternating current (AC) power supply.

It is another object of the present invention to provide a power supply of the type as described above that is particularly well suited for use in static neutralization systems.

It is yet another object of the present invention to provide a power supply of the type as described above that is reliable and less susceptible to early operational failure due to partial electrical discharge along the voltage supply path.

It is still another object of the present invention to provide a power supply of the type as described above that has optimal performance characteristics.

It is yet still another object of the present invention to provide a power supply of the type as described above that has a limited number of parts, is inexpensive to manufacture and is easy to assemble.

Accordingly, as a feature of the present invention, there is provided high-voltage, alternating current (AC) power supply, comprising (a) an outer housing shaped to define an interior cavity, (b) a high-voltage transformer disposed at least partially within the interior cavity, the transformer being adapted to receive a supply of power through a primary winding, and (c) an output connector module disposed at least partially within the interior cavity, the output connector module being electrically coupled to the transformer through a secondary winding, the output connector comprising a resistive damping component, (d) wherein the transformer and the output connector module are separate from one another and are independently mechanically coupled to the housing.

Various other features and advantages will appear from the description to follow. In the description, reference is made to the accompanying drawings which form a part thereof, and in which is shown by way of illustration, an embodiment for practicing the invention. The embodiment will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE INVENTION

Construction of Power Supply 111

Figure 1:
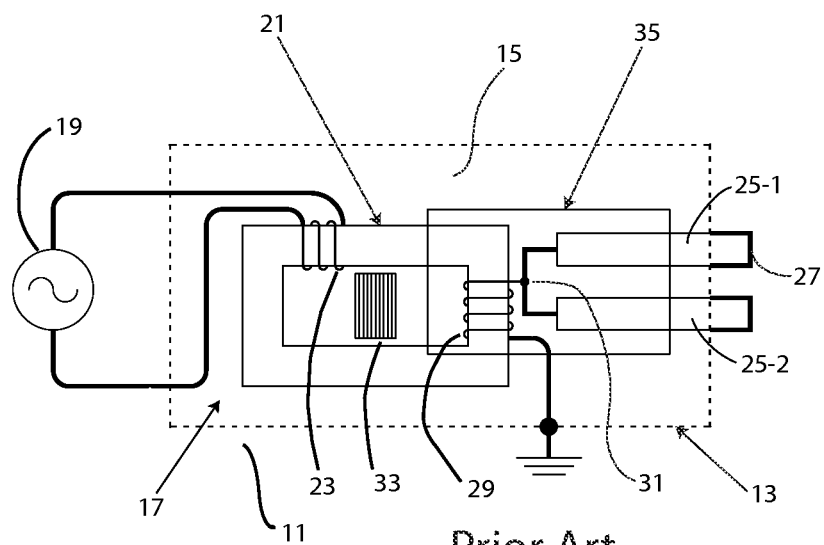
FIG. 1 is a simplified schematic representation of a conventional, high-voltage, alternating current (AC), power supply for a static neutralization system.

Referring now to FIGS. 2(a), 2(b), 3 and 4, there is shown a high-voltage, alternating current (AC) power supply that is constructed according to the teachings of the present invention, the power supply being identified generally by reference numeral 111. As will be described in detail below, power supply 111 is designed to provide high-voltage, AC power to an electrical device connected thereto.

Due to its particular set of performance characteristics, power supply 111 is particularly well suited for use in static neutralization systems, with power supply 111 providing high-voltage, AC power to one or more anti-static bars connected thereto. However, it is to be understood that power supply 111 is not limited to use in static neutralization systems, but rather, could be utilized in other systems that require the delivery of high-voltage, AC power without departing from the spirit of the present invention.

Power supply 111 comprises an outer housing, or chassis, 113 into which is disposed a supply circuit 115. As a principal feature of the present invention, the particular design of supply circuit 115 provides power supply 111 with a number of notable advantages over traditional high-voltage, AC power supplies (e.g., prior art power supply 11), which will be explained further in detail below.

Figure 2A:
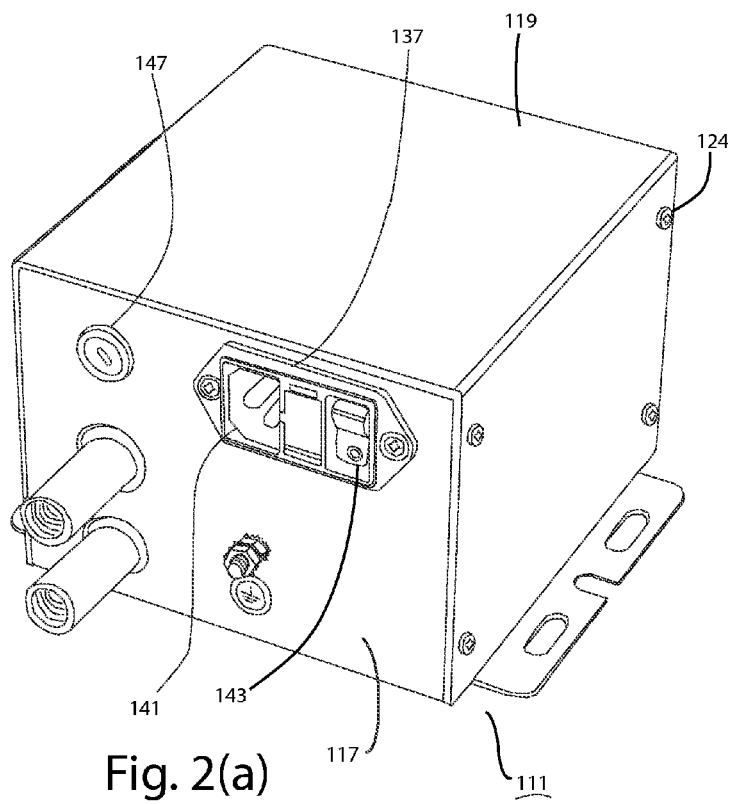
FIGS. 2(a) and 2(b) are front perspective and top plan views, respectively, of a high-voltage, AC power supply constructed according to the teachings of the present invention.
Figure 2B:
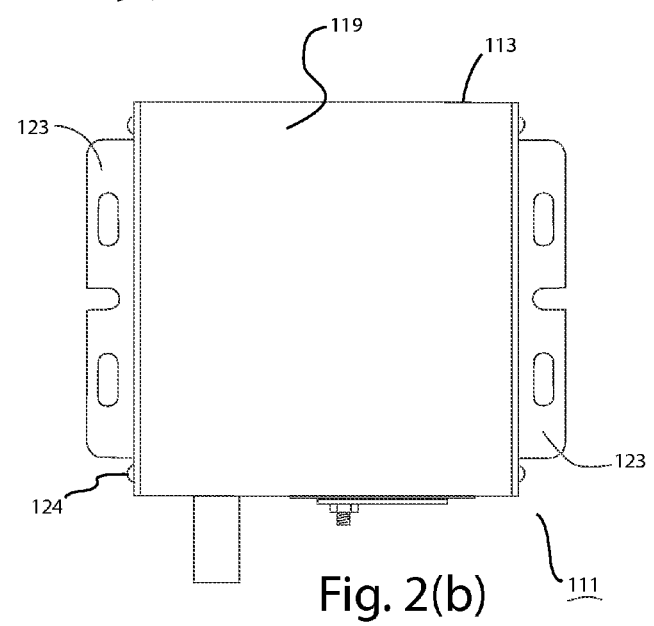
Figure 3:
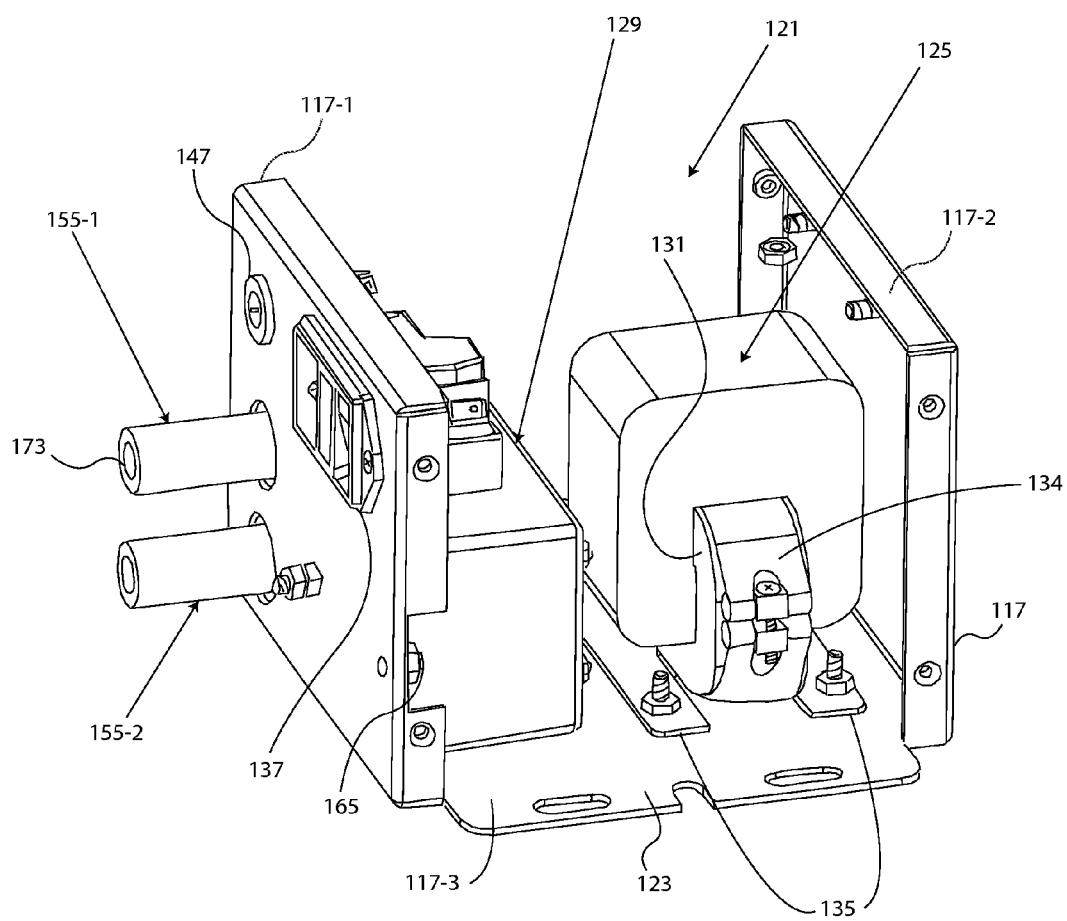
FIG. 3 is a side perspective view of the high-voltage, AC power supply shown in FIG. 2(a), the power supply being shown without the chassis cover and selected wiring for ease of illustration.

As seen most clearly in FIGS. 2(a), 2(b) and 3, chassis 113 is preferably in the form of a generally enclosed, box-shaped member that is constructed of a rigid and durable material, such as metal. In the present embodiment, chassis 113 comprises a base 117 and a complementary cover 119 that together define an enlarged, generally enclosed, interior cavity 121. In this capacity, upon assembly, power supply 111 is rendered a unitary, modular item.

Base 117 is represented herein as a three-sided, upstanding U-shaped member that includes a front wall 117-1 and a rear wall 117-2 that extend orthogonally up from opposing edges of a bottom wall 117-3. To assist in mounting chassis 113 on a desired support surface, each of the opposing side edges of bottom wall 117-3 preferably terminates into a flattened mounting flange 123. Additionally, as will be explained further below, external access to selected components of supply circuit 115 is achieved primarily through front wall 117-1.

Cover 119 is represented herein as a three-sided, inverted U-shaped member that is dimensioned to fittingly mount onto base 117 and enclose interior cavity 121. A plurality of fastening elements, such as screws, 124 are then driven transversely through base 117 and cover 119 to retain chassis 113 as a unitary item.

Figure 4:
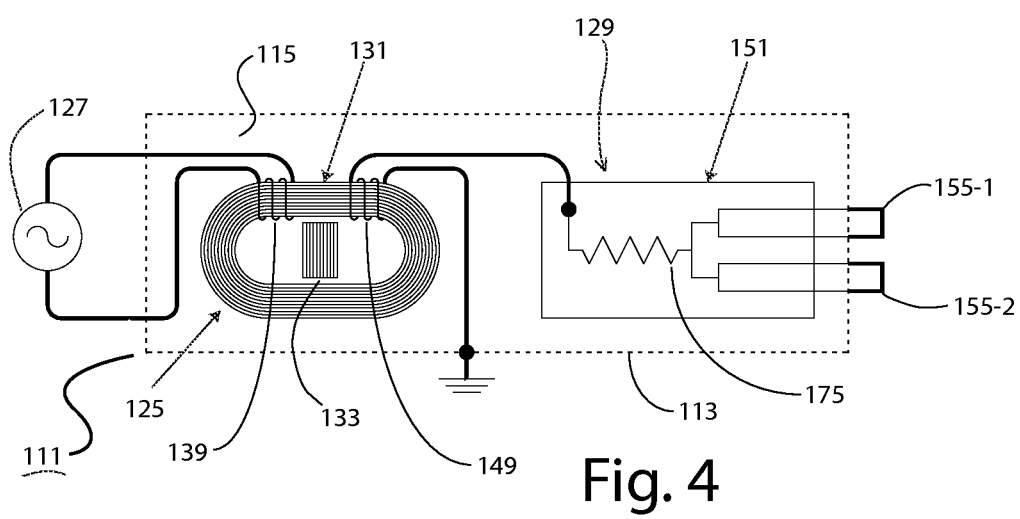
FIG. 4 is a simplified schematic representation of the high-voltage, AC power supply shown in FIG. 2(a)
Figure 5:
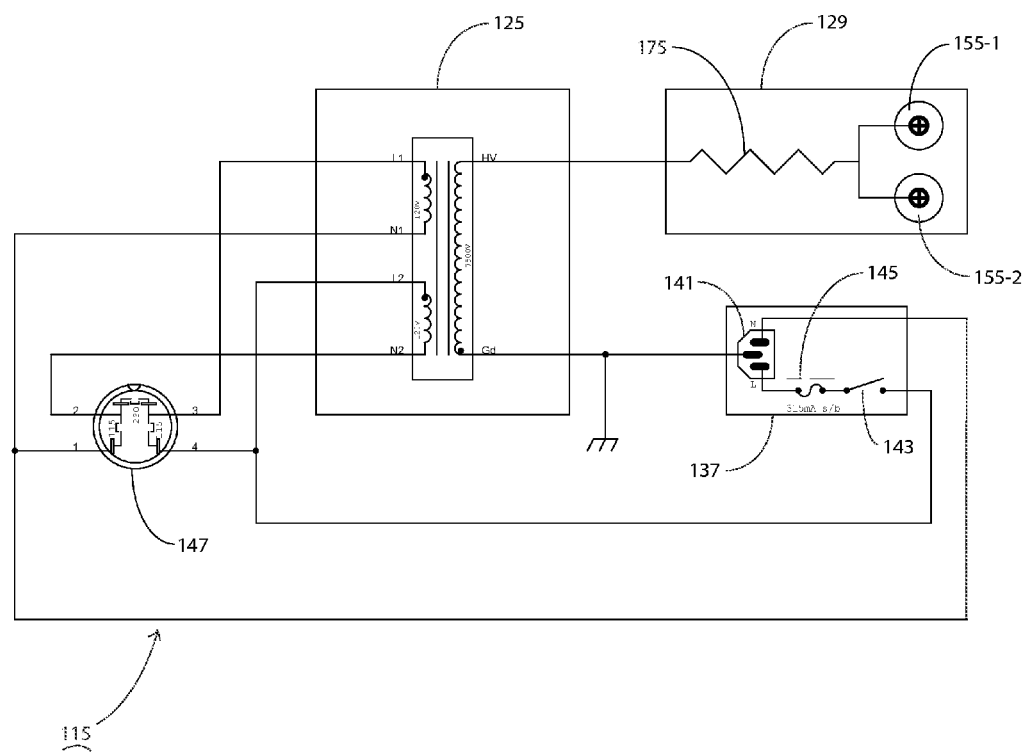
FIG. 5 is a detailed electrical schematic representation of the high-voltage, AC power supply shown in FIG. 2(a)

Referring now to FIGS. 3-5, supply circuit 115 is disposed within interior cavity 121 and preferably includes a high-voltage transformer 125 for stepping up, or increasing, the voltage produced from an external AC power source 127 (e.g., AC mains electricity) and an output connector module, or subassembly, 129 in electrical communication with transformer 125.

As a feature of the present invention, transformer 125 and module 129 remain physically separated from one another and are independently mounted onto chassis 113 within interior cavity 121, as seen most clearly in FIG. 3. As a result, transformer 125 is preferably of the off-the-shelf variety, thereby reducing manufacturing costs and accelerating product development, which is highly desirable. For example, transformer 125 may be a high-voltage transformer of the type currently available for sale by Well Electronics Co., Ltd., under model number CC-5020.

By contrast, conventional power supplies, such as prior art power supply 11, typically encapsulate at least a portion of the transformer and output connectors within a common dielectric cup, as referenced previously. Consequently, the transformer utilized in a traditional power supply (e.g., power supply 11) typically needs to be custom designed to fit the dimensional constraints associated with its mounting within the power supply chassis in relation to the other components. As can be appreciated, the need for a customized transformer serves to increase overall manufacturing costs, which is highly undesirable.

Transformer 125 includes an oval-shaped magnetic core 131 that is preferably cut into two separate sections (e.g., an upper, inverted U-shape half and a lower, U-shaped half) for ease of assembly during manufacture. In particular, the separation, or cutting, of core 131 into two separate sections enables the primary winding for transformer 125, which is in the form of a bobbin, to be slid axially over the upper half of core 131 at one end thereof and the secondary winding for transformer 125, which is similarly in the form of a bobbin, to be slid axially over the upper half of core 131 at the opposite end thereof.

A magnetic shunt 133, which is constructed using a combination of dielectric and magnetic sheet materials, is coupled to core 131 to provide transformer 125 with overload protection. Shunt 133 is preferably wedged, or shimmed, between the upper and lower halves of core 131 and, in turn, is located between the primary and secondary windings. A C-shaped, screw-tightened, clamping band 134 is then mounted onto one end of core 131 and is tightened to permanently re-secure the upper and lower halves of core 131 in its original configuration, with shunt 133 firmly wedged therebetween.

A mounting bracket 135 is provided to secure transformer 125 to chassis 113. Mounting bracket 135 is preferably constructed as a single piece of sheet steel that is die-cut and stamped to include a central band, or strip, that conforms against at the bottom exterior surface of core 131 and is, in turn, wedged tightly between core 131 and clamping band 134 during the process of tightening band 134. An exposed, planar, flange extends laterally outward from each side of the central strip, lies flush against the inner surface of bottom wall 117-3, and is secured thereto by fasteners, thereby fixedly securing transformer 125 in place within interior cavity 121 in a spaced apart relationship relative to module 129.

As a feature of the present invention, magnetic core 131 is preferably of the tape-wound variety, which is commonly formed by winding a grain-oriented material (e.g. Hipersil) into a more rounded geometric configuration (e.g., into a generally oval shape). As can be appreciated, the use of a tape-wound core is preferred over a traditional laminated core due to, among other things, its enhanced efficiency, consistency in performance, stability with respect to time and temperature, flux density uniformity and saturation level.

However, it is to be understood that tape-wound cores are not traditionally utilized in high-voltage, AC power supplies because the relatively high capacitance of a load typically connected thereto (e.g., an anti-static bar) causes an increase in the output voltage to an excessive level (due to resonance). Additionally, for a lossless power supply running at normal operating voltages with normal capacitive loads, the secondary current produced by the transformer often exceeds the short-circuit threshold current.

As will be explained in detail below, supply circuit 115 is provided with a novel damping component in order to control, or otherwise regulate, the output voltage and secondary current to a level so that a tape-wound core can be utilized, the inclusion of the damping component serving as a principal novel feature of the present invention.

It should also be noted that high-voltage transformer 125 operates in a nonlinear fashion, which can create non-ideal conditions. As will become apparent below, the nonlinear characteristics of transformer 125 render the design of the damping component to be considerably challenging.

As noted briefly above, input power (e.g., AC mains electricity) is preferably applied to transformer 125 from an external AC power source 127. Specifically, an input power connection module 137 is preferably mounted in front wall 117-1 and is coupled to magnetic core 131 by a primary winding 139.

As seen most clearly in FIGS. 2(a), 3 and 5, input power connection module 137 includes a three-prong, receptacle-type power connector 141 (e.g. an IEC-320 type power connector), which is adapted to receive a plug from a power cable (not shown) connected to AC power source 127. Connector 141 is in turn connected to primary winding 139, thereby establishing an input voltage path between AC power source 127 and high-voltage transformer 125.

Module 137 additionally includes a rocker switch 143 and a 315 mA fuse 145 that are connected in series along the input voltage path between connector 141 and transformer 125. As shown, rocker switch 143 is externally accessible and thereby provides manual means for activating and deactivating operation of power supply 111.

Supply circuit 115 additionally includes a voltage selection switch 147 which is mounted in front wall 117-1 of chassis 117 in an externally accessible manner. Switch 147 is located along the input voltage path between AC power source 127 and high-voltage transformer 125 and provides means to accommodate for regional variances in AC mains voltage (e.g., to accommodate both 115 volt and 230 volt AC mains electricity).

As referenced briefly above, supply circuit 115 includes an output connector module, or subassembly, 129 that is separately and independently mounted onto chassis 113 in relation to transformer 125. This separation of the physical mounting (i.e., the mechanical coupling) of module 129 and transformer 125 onto chassis is significant, inter alia, in simplifying the assembly of power supply 111 and thereby reducing overall manufacturing costs.

Transformer 125 preferably includes a secondary winding 149 in the form of a high-voltage, flying lead connector, with one end of winding 149 connected to ground and the other end of winding 149 connected to module 129. In this capacity, winding 149 establishes a voltage path from transformer 125 to output connector module 129. Additionally, the use of a flying lead-type connector affords greater ease in the design and assembly of power supply 111.

Output connector module 129 provides means for connecting a high-voltage load, such as one or more anti-static bars, to supply circuit 115, thereby enabling the delivery of high-voltage power from transformer 125 to the desired load. As feature of the present invention, module 129 is provided with a novel damping component in order to control, or otherwise regulate, the output voltage and the secondary current delivered to the desired load.

Specifically, referring now to FIGS. 3-7, output connector module 129 comprises an outer protective casing 151 that is directly mounted onto the inner surface of front wall 117-1, a printed circuit board (PCB) 153 disposed within casing 151 in electrical connection with secondary winding 149, and a pair of output connectors 155-1 and 155-2 coupled to PCB 153 in electrical communication therewith. Each connector 155 projects through a corresponding opening in both casing 151 and front wall 117-1 and is therefore externally accessible for connection to a desired capacitive load, as will be explained further below.

Casing 151 is preferably constructed of a dielectric material, such as plastic, and includes a rigid base 157 and a complementary cover 159 which together define an interior cavity 161 dimensioned to receive PCB 153.

Base 157 is represented herein as an open, generally rectangular, box-shaped member that includes an enclosed bottom wall 157-1 and four upstanding sidewalls 157-2, 157-3, 157-4 and 157-5 that together define interior cavity 161. Flanges 163-1 and 163-2 project outwardly from the free edge of sidewalls 157-3 and 157-5, respectively. By driving a fastening element 165, such as a complementary nut and screw, through a preformed opening in each of flange 163 and front wall 117-1, base 157 can be retained securely against chassis 113, as shown in FIG. 3.

Figure 6C:
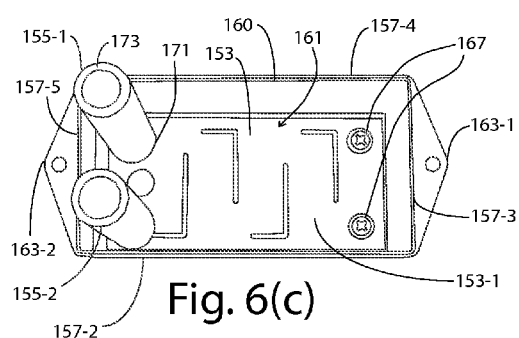
FIG. 6(c) is front perspective view of the output connector module shown in FIG. 6(a), the casing for the module being shown with its cover removed therefrom.
Figure 6B:
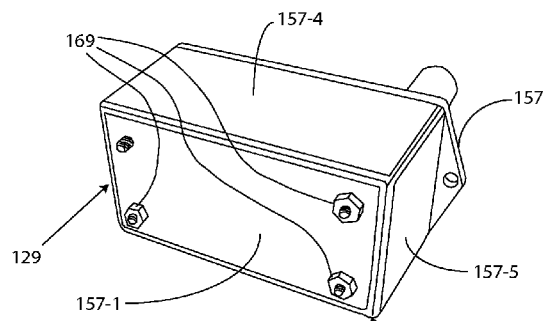
FIGS. 6(a) and 6(b) are bottom perspective and front perspective views, respectively, of the output connector module shown in FIG. 3.
Figure 6A:
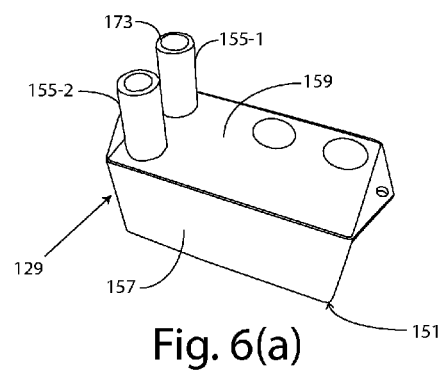

Referring now to FIGS. 6(a) and 6(c), cover 159 is represented herein as a flattened plate that is dimensioned to fittingly mount onto a narrow interior shelf 160 formed along the inner, free edge of base 157. In this manner, cover 159 serves to substantially enclose interior cavity 161 and thereby protect any sensitive electrical components retained therein. Importantly, cover 159 minimizes the strength of the electric field within the clearance gap defined between output connectors 155 and front wall 117-1, thereby reducing the risk of partial discharge in that region. Cover 159 additionally reduces the visible portion of the aforementioned clearance gap, thereby enhancing the overall aesthetics of power supply 111.

Figure 7:
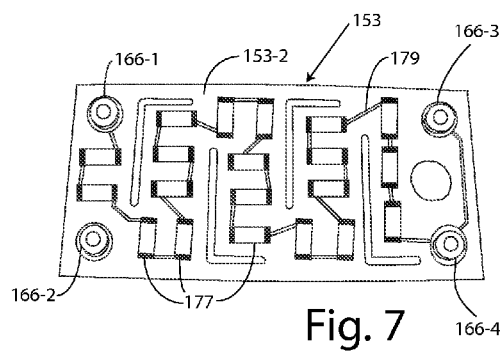
FIG. 7 is a rear perspective view of the printed circuit board (PCB) shown in FIG. 6(c)

Referring now to FIGS. 6(c) and 7, PCB 153 is disposed within interior cavity 161 against the interior of bottom wall 157-1. As seen most clearly in FIG. 7, PCB 153 includes four separate, internally threaded, conductive bores, or contacts, 166-1 thru 166-4, with one contact 166 located in each of its corners. In the present embodiment, conductive contact 166-1 serves as the input terminal for PCB 153 and, as such, is connected to secondary winding 149. Similarly, conductive contacts 166-3 and 166-4, serve as the output terminals for PCB 153, and as such, are connected to output connectors 155-1 and 155-2, respectively, as will be explained further in detail below.

PCB 153 is fixed to bottom wall 157-1 by driving a screw 167 through each bore 166 and, in turn, partially through a preformed, aligned hole in bottom wall 157-1. Although not shown herein, it is to be understood that PCB 153 could be spaced slightly away from bottom wall 157-1 by disposing one or more standoffs, or spacers, therebetween. For instance, a generally cylindrical, metal tube, either ⅜ or ½ inches in length, could coaxially receive each screw 167 so as to create clearance between between PCB 153 and bottom wall 157-1, while maintaining a conductive path.

A threaded nut 169 is tightened onto the distal end of each screw 167 extending outside of casing 151, thereby securing PCB 153 in place within interior cavity 161. As such, it is to be understood that each complementary set of screws 167 and nuts 169 not only serves to secure PCB 153 to base 157 but also serves as a means to facilitate the conductive coupling of secondary winding 149 to PCB 153 and, in turn, to output connectors 155. For instance, the particular screw 167 that is disposed through input contact, or terminal, 166-1 is designed to be conductively coupled to secondary winding 149, such as by disposing a ring terminal (not shown) for secondary winding 149 over screw 167 and securing the ring terminal in contact therewith by its complementary nut 169.

Each output connector 155 is represented herein as a generally cylindrical, or tubular, member that is constructed out of a dielectric material. Each connector 155 includes a first, or proximal, end 171 and a second, or distal, end, 173. As seen most clearly in FIG. 6(c), first end 171 of connectors 155-1 and 155-2 is directly mounted on front surface 153-1 of PCB 153 in coaxial alignment with output contacts 166-3 and 166-4, respectively. To secure each connector 155 onto PCB 153, an axial screw 167 is disposed through an internally countersunk bore formed inside proximal end 171, through a corresponding, internally threaded bore 166 on PCB 153 and out through bottom wall 157-1. By securing a threaded nut 169 onto the free end of screw 167, as shown in FIG. 6(b), connector 155 is fixedly retained onto PCB 153 and extends out from front surface 153-1 an orthogonal relationship relative thereto, as shown in FIG. 6(a).

As seen most clearly in FIGS. 3 and 6(a), distal end 173 of each output connector 155 extends outside chassis 113 and is internally threaded. Accordingly, a high-voltage, capacitive load, such as an anti-static bar, can be connected to power supply 111 by screwing the male connector of a high-voltage cable, which is in connection with the load, into distal end 173 until a contact (e.g., a spring contact) on the male connector is drawn into direct contact with screw 167, thereby establishing a conductive path between the load and PCB 153 via its associated contact 166 and screw 167.

As referenced briefly above and shown schematically in FIGS. 4 and 5, module 129 includes a damping component 175 to control the output voltage and secondary current to an acceptable level. In the present embodiment, damping component 175 is represented in FIG. 7 as a plurality of equal-value, commodity resistors 177 that are mounted on back surface 153-2 of PCB 153. Resistors 177 are connected in series between contact 166-1 and 166-4 by a conductive lead, or trace, 179 and together form a power resistor that provides resistance along the supply path.

However, it should be noted that damping component 175 need not be limited to the design shown herein. Rather, it is to be understood that alternative means for providing resistance along the supply path could be configured without departing from the spirit of the present invention. For instance, an alternative type and/or number of resistors could be utilized to provide resistance along the supply path.

The cumulative resistance of damping component 175 is selected to provide damping of the output voltage that arises due to the relatively high capacitance of the load (e.g., anti-static bars connected thereto) as well as the relatively high self-inductance of secondary winding 149. As a result, damping component 175 serves to prevent the output voltage from being excessive, or otherwise induced by resonance in supply circuit 115, thereby resulting in a more reliable power supply 111.

It should also be noted that damping component 175 requires a significant amount of space within power supply 111. Due to the independent mounting of module 129 and transformer 125 onto chassis 113, module 129 can be designed to efficiently account for the relatively substantial size requirement of damping component 175.

Operation of Power Supply 111

Power supply 111 is designed to provide high-voltage, AC power to an electrical device connected thereto in the manner set forth below. Specifically, external AC power source 127 is connected to supply circuit 115 by connecting the plug of a power cable coupled to AC power source 127 to receptacle-type power connector 141. Additionally, one or more high-voltage, capacitive loads are connected to power supply 111 by screwing the male connector of a high-voltage cable in connection with each load into distal end 173 of an associated connector 155.

Accordingly, with switch 143 closed, voltage supplied from power source 127 is stepped up by transformer 125 and delivered to the load via output connector module 129. As a principal feature of the present invention, damping component 175 serves to control the output voltage and secondary current applied to the load to an acceptable level.

Figure 8B:
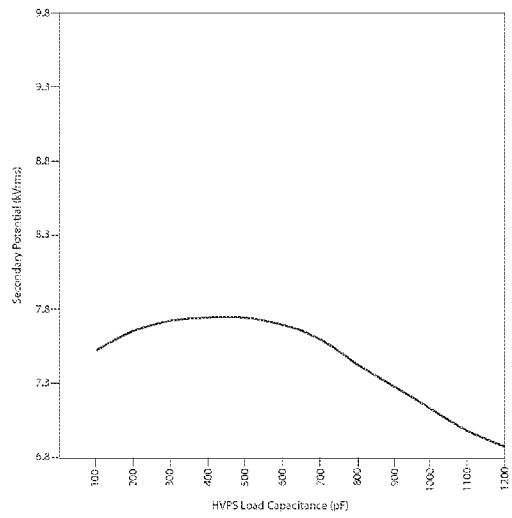
FIGS. 8(a) and 8(b) are graphical representations of output potential versus load capacitance that are useful in understanding the effect of the damping component shown in FIG. 4 on the overall performance of the AC power supply.
Figure 8A:
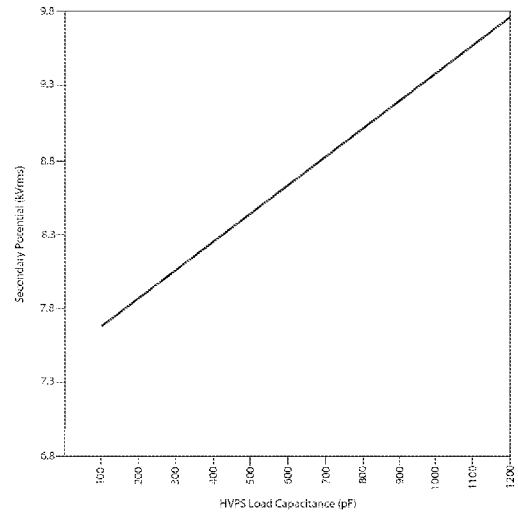

Specifically, referring now to FIGS. 8(*a*) and 8(*b*), there are shown graphical representations that are useful in understanding the effect of damping component 175 on supply circuit 115. In a static neutralization application, the load coupled to power supply 111 is typically in the form one or more conventional anti-static bars, and it is to be understood that a conventional anti-static bar carries a relative large capacitance (e.g., in the range from a couple hundred pF to several thousand pF).

Due to the inductance of secondary winding 149, the output impedance of power supply 111 is reactive. This inductive reactance of power supply 111, combined with the capacitive reactance of the load, causes circuit resonance. As will be shown below, the presence of resonance can negatively impact the performance of a power supply within a static neutralization system.

In a lossless power supply (e.g., prior art power supply 11), the aforementioned resonance results in a large variance in output voltage in relation to load capacitance, as represented in FIG. 8(*a*). As can be seen, the maximum increase of output voltage within the particular load range can be as large as 20%-30%. This increase in output voltage can stress and prematurely breakdown the dielectric components within the power supply, which is highly undesirable.

By contrast, power supply 111 experiences a variance in output voltage that is limited to well under 10%, as represented in FIG. 8(*b*). As can be appreciated, the greater regulation of output voltage that can be achieved due to the incorporation of damping component 175 minimizes the effects of partial discharge and renders power supply 111 less susceptible to dielectric breakdown and premature aging, which is a principal object of the present invention.

Determining the Resistive Value of Damping Component 175

As set forth above, the introduction of a resistive component along the secondary portion of the supply path can result in "critical" damping and thereby limit the effects of resonance. Critical damping can be achieved by selecting a damping component 175 with a resistance that is approximately equal in magnitude to the square root of the ratio of the self-inductance of secondary winding 149 divided by the load capacitance, which is also referred to as the "characteristic impedance." (i.e., $R_C \approx [L_T/C_T]^{1/2}$).

Measurement of the self-inductance of secondary winding 149 is preferably collected under normal operating voltages across the range of expected loads. Measuring the self-inductance of secondary winding 149 cannot be simply collected by short-circuiting primary winding 139 due to the large difference in the characteristics of magnetic core 131 at operating voltages (i.e., using an AC mains input voltage) versus instrument-measurement voltages, which are relatively small. Additionally, due to the influence of the capacitance of the load on the self-inductance of transformer 125, it is important that the self-inductance measurement be collected across the range of expected loads.

Once high-voltage transformer 125 has been characterized in a lossless power supply configuration, as described above, an initial value of the damping resistance, $R_d(ini)$, for component 175 can be calculated to roughly achieve critical damping at a selected value of load capacitance in the required range. The value selected for the load should be such that the secondary voltage is maximized within the applicable load capacitance range, which may or may not be the maximum capacitance value within the specified range. The initial selected resistive value for component 175 is then preferably applied to the output of a lossless power supply configuration (i.e., across secondary winding 149) to determine the effective short-circuit current, $I_{SC}(ini)$, of the lossless power supply with the added damping component. The initial power rating, $P_R(ini)$, which is required so that the damped power supply can sustain an arc-over or short-circuit condition for an indefinite period of time, can then be calculated using the following equation: $P_R(ini) = I_{SC}(ini)^2 \times R_d(ini)$.

Using the initially selected damping resistance, $R_d(ini)$, a series of measurements are collected in order to evaluate and, in turn, optimize performance of the power supply. For instance, if the initially selected damping resistance, $R_d(ini)$, is too high, the power supply becomes overdamped, resulting in an output voltage that may be too low for the maximum required load capacitance. By contrast, if the initially selected damping resistance, $R_d(ini)$, is too low, the power supply becomes underdamped, resulting in an output voltage and/or secondary current that may be too high for the required load range.

By repeatedly adjusting the damping resistance value (as well as potentially modifying certain aspects in the design of magnetic shunt 133, such as by changing its material and/or geometry), by taking certain measurements (e.g., input voltage, output voltage, phase lag, and voltage along secondary winding 149) and by assessing the results, key performance parameters (e.g., maximum output voltage, maximum secondary current, short-circuit secondary current, and load capacitance range) of power supply 111 can be optimized. As a final optimization step, damped power supply 111 can be tested with anti-static bars for ionization performance by using a charge plate analyzer. Discrete capacitors with one short (i.e., small) anti-static bar can be used to emulate the load of varying lengths and number of bars.

Due to the inherent nonlinear behavior of transformer 125, caused primarily by shunt 133, it is preferred that the aforementioned measurements be taken using a sufficient number of discrete capacitive loads, throughout the applicable load range, in order to accurately characterize performance of transformer 125. A linear circuit model can then be applied to derive, for each load capacitance, effective linear circuit parameters, such as flux linkage and energy in the windings, which in turn can be useful in the design of damping component 175.

It is to be understood that the embodiment described in detail above is intended to be merely exemplary and those skilled in the art shall be able to make numerous variations and modifications without departing from the spirit of the present invention. All such variations and modifications are intended to be within the scope of the present invention as defined in the appended claims.

What is claimed is:

1. A high-voltage, alternating current (AC) power supply, comprising:
   (a) an outer housing shaped to define an interior cavity;
   (b) a high-voltage transformer disposed at least partially within the interior cavity, the transformer being adapted to receive a supply of power through a primary winding; and
   (c) an output connector module disposed at least partially within the interior cavity, the output connector module being electrically coupled to the transformer through a secondary winding, the output connector module comprising a resistive damping component, the output connector module additionally comprising:
      (i) a dielectric casing directly mounted on the outer housing within the interior cavity in a spaced apart relationship relative to the transformer, the dielectric casing comprising:
         (A) a base that includes an enclosed bottom wall and four upstanding sidewalls that together define an interior cavity, and
         (B) a planar cover mounted on the base for enclosing the interior cavity defined by the base,
      (ii) a printed circuit board disposed within the interior cavity defined by the base, the printed circuit board being in electrical connection with the secondary winding, and
      (iii) at least one output connector coupled to the printed circuit board, the at least one connector being externally accessible and adapted to electrically connect with a high-voltage load,
   (d) wherein the transformer and the output connector module are separate from one another and are independently mechanically coupled to the housing.

2. The high-voltage, AC power supply as claimed in claim 1 wherein the secondary winding carries a resistance, the resistance of the damping component being at least two times greater than the resistance of the secondary winding.

3. The high-voltage, AC power supply as claimed in claim 1 wherein the secondary winding carries a resistance, the resistance of the damping component being at least four times greater than the resistance of the secondary winding.

4. The high-voltage, AC power supply as claimed in claim 1 wherein the damping component comprises a plurality of discrete resistors mounted on the printed circuit board, the plurality of discrete resistors being connected in series.

5. The high-voltage, AC power supply as claimed in claim 1 wherein the printed circuit board is in electrical connection with the secondary winding through at least one high-voltage, flying lead connector.

6. The high-voltage, AC power supply as claimed in claim 1 wherein the dielectric casing is mounted on the outer housing with the planar cover disposed in direct abutment thereagainst.

7. The high-voltage, AC power supply as claimed in claim 6 wherein the printed circuit board is coupled to the bottom wall of the base by a plurality of fastening elements.

8. The high-voltage, AC power supply as claimed in claim 7 further comprising a plurality of contacts mounted on the printed circuit board.

9. The high-voltage, AC power supply as claimed in claim 8 wherein each of the plurality of contacts is adapted to conductively receive one of the plurality of fastening elements.

10. The high-voltage, AC power supply as claimed in claim 9 wherein the at least one output connector includes a proximal end directly mounted on the printed circuit board and a distal end adapted to be coupled to a load.

11. The high-voltage, AC power supply as claimed in claim 10 wherein the proximal end of the at least one output connector is conductively mounted on one of the plurality of contacts on the printed circuit board.

12. The high-voltage, AC power supply as claimed in claim 11 wherein the distal end of the at least one output connector extends outside both the dielectric casing and the outer housing.

13. The high-voltage, AC power supply as claimed in claim 1 wherein the transformer comprises a magnetic core around which the primary winding and the secondary winding are wound.

14. The high-voltage, AC power supply as claimed in claim 13 wherein the magnetic core is preferably a tape-wound magnetic core.

15. The high-voltage, AC power supply as claimed in claim 14 further comprising a magnetic shunt wedged within the magnetic core.

16. The high-voltage, AC power supply as claimed in claim 15 wherein the magnetic core is directly secured to the outer housing by at least one mounting bracket.

* * * * *